United States Patent
Tang

(10) Patent No.: US 10,175,514 B2
(45) Date of Patent: Jan. 8, 2019

(54) METHOD FOR MANUFACTURING DISPLAY PANEL

(71) Applicant: Wuhan China Star Optoelectronics Technology Co., Ltd., Wuhan, Hubei (CN)

(72) Inventor: Yuejun Tang, Guangdong (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 129 days.

(21) Appl. No.: 15/327,989

(22) PCT Filed: Dec. 27, 2016

(86) PCT No.: PCT/CN2016/112470
§ 371 (c)(1),
(2) Date: Jan. 20, 2017

(87) PCT Pub. No.: WO2018/119703
PCT Pub. Date: Jul. 5, 2018

(65) Prior Publication Data
US 2018/0210263 A1 Jul. 26, 2018

(51) Int. Cl.
*H01L 21/00* (2006.01)
*G02F 1/1333* (2006.01)
(Continued)

(52) U.S. Cl.
CPC ...... *G02F 1/133305* (2013.01); *G02F 1/1341* (2013.01); *H01L 51/003* (2013.01);
(Continued)

(58) Field of Classification Search
CPC ......... H01L 2251/5338; H01L 51/0097; H01L 51/5253; H01L 51/003; H01L 2227/326
See application file for complete search history.

(56) References Cited

U.S. PATENT DOCUMENTS

2009/0061721 A1* 3/2009 Isa ............... H01L 27/1214
445/24
2015/0048329 A1* 2/2015 Kim ............... H01L 51/5253
257/40
(Continued)

FOREIGN PATENT DOCUMENTS

CN 103337478 A 10/2013
CN 103928398 A 7/2014
(Continued)

*Primary Examiner* — Jaehwan Oh
*Assistant Examiner* — John M Parker
(74) *Attorney, Agent, or Firm* — Andrew C. Cheng

(57) ABSTRACT

The present disclosure provides a method for manufacturing display panel. The manufacturing method includes: S1: providing a support substrate; S2: arranging a glass substrate on the support substrate; S3: arranging a flexible substrate on the glass substrate; S4: arranging a pad area on the flexible substrate; S5: completing the display panel into a box process or packaging process; S6: peeling off the support substrate; S7: cutting the glass substrate and the flexible substrate in accordance with a predetermined display panel size, and peeling the glass substrate and the flexible substrate after the cutting. The method of manufacturing a display panel using a thin and light glass substrate is possible to avoid the occurrence of severe drooping and warping which can prevent the drooping and the overall warping of the both ends of the thin glass substrate, thereby enhancing the convenience and the accuracy in the manufacturing process.

2 Claims, 5 Drawing Sheets

(51) Int. Cl.
*G02F 1/1341* (2006.01)
*H01L 51/00* (2006.01)
*H01L 51/56* (2006.01)
*G02F 1/1362* (2006.01)
*G02F 1/1335* (2006.01)
*H01L 51/52* (2006.01)

(52) U.S. Cl.
CPC .......... *H01L 51/0097* (2013.01); *H01L 51/56* (2013.01); *G02F 1/1362* (2013.01); *G02F 1/133514* (2013.01); *G02F 2001/133302* (2013.01); *H01L 51/5253* (2013.01); *H01L 2251/5338* (2013.01); *H01L 2251/566* (2013.01)

(56) References Cited

U.S. PATENT DOCUMENTS

| | | | |
|---|---|---|---|
| 2016/0066409 A1* | 3/2016 | Kwon .................... | H05K 1/028 174/254 |
| 2016/0266426 A1* | 9/2016 | Song .................... | G02F 1/13306 |
| 2017/0032737 A1* | 2/2017 | Lee ...................... | G09G 3/3225 |
| 2017/0278878 A1* | 9/2017 | Kuwabara ......... | H01L 21/67092 |

FOREIGN PATENT DOCUMENTS

| | | |
|---|---|---|
| CN | 104349894 A | 2/2015 |
| CN | 105118844 A | 12/2015 |
| CN | 105974626 A | 9/2016 |
| WO | WO2010095215 A1 | 8/2010 |

* cited by examiner

METHOD FOR MANUFACTURING DISPLAY PANEL

FIELD OF THE DISCLOSURE

The present disclosure relates to a display panel manufacturing technology field, and more particularly to a method for manufacturing display panel, and more particularly to a method for manufacturing a liquid crystal display panel and an organic electroluminescence display panel.

BACKGROUND OF THE DISCLOSURE

In recent years, the display is moving toward the development of light, especially with the portable electronic products thinner requirements continue to improve, flat-panel displays (such as the liquid crystal display (LCD) or OLED display, etc.) for use in portable electronic products are required to be thinner and thinner and lighter in weight, thus improving the portability of portable electronic products. In addition, large-scale electronic products such as televisions, thin and light of the display can reduce the space occupied, and can give the audience a more comfortable experience.

In a flat panel display, a glass substrate is generally used as a carrier for carrying other display elements, whereas in a flat panel display, the glass substrate is the component having the largest ratio. In order to reduce the thickness and weight of the flat panel display, the most effective method is to reduce the thickness and weight of the glass substrate. The thinner the glass, the more prone to bending, so the production process of thin glass substrate prone to drooping and warping. Methods of reducing the thickness and weight of the glass substrate include: 1. the glass substrate is reduced in thickness and weight by etching the glass substrate; 2. direct use of thin glass substrates. In the first method, after the display panel is assembled, the glass etching process is additionally performed to reduce the thickness and weight of the glass substrate. The disadvantage of this method is that the glass etching process may fail, and the manufacturing cost is greatly increased. In the second method, the thinner the glass substrate is more likely to bend, especially as the size of the glass substrate increases, the production of thin glass substrates prone to serious drooping and warping, in addition, during the transportation of the thin glass substrate, even a small impact during loading and unloading can cause the thin glass substrate to warp quickly, thereby damaging the glass substrate.

SUMMARY OF THE DISCLOSURE

In order to solve the above-mentioned problems of the prior art, it is an object of the present disclosure to provide a method for manufacturing display panel, the method including the steps of: S1: providing a support substrate; S2: arranging a glass substrate on the support substrate; S3: arranging a flexible substrate on the glass substrate; S4: arranging a pad area on the flexible substrate; S5: completing the display panel into a box process or packaging process S6: peeling off the support substrate; S7: Cutting the glass substrate and the flexible substrate in accordance with a predetermined display panel size, and peeling the glass substrate and the flexible substrate after the cutting.

Further, the support substrate is made of glass, the thickness of the support substrate is between 0.5 mm to 1 mm; the thickness of the glass substrate is between 0.05 mm to 0.4 mm.

Further, in the step S2, the method of arranging the glass substrate on the support substrate specifically includes: by bonding the support substrate and the glass substrate to each other in a vacuum state, or bonding the support substrate and the glass substrate together with an adhesive agent.

Further, in the step S3, the method of arranging the flexible substrate on the glass substrate specifically includes: coating a flexible material on the glass substrate by a coating process, curing the flexible material, or affixing a prepared flexible substrate on the glass substrate through an adhesive.

Further, in the step S6, the method of peeling off the support substrate specifically includes: subjecting the support substrate to a plasma treatment, or by forming a protrusion pattern on the surface of the support substrate in advance, so as to reduce the adhesion force between the glass substrate and the support substrate, by ejecting air into the space between the support substrate and the glass substrate by a predetermined air ejection device to peel off the support substrate.

Further, in the step S7, the method of cutting the glass substrate and the flexible substrate in accordance with a predetermined display panel size, and peeling the glass substrate and the flexible substrate after the cutting specifically includes: cutting the glass substrate in accordance with the predetermined display panel size, peeling off the bonding pad area of the flexible substrate with respect to the glass substrate, and cutting off the flexible substrate connected between the two adjacent display panels; or cutting the glass substrate in accordance with the predetermined display panel size, cutting off the flexible substrate connected between the two adjacent display panels, and peeling each glass panel of the display panel opposite to the pad area of the flexible substrate.

Further, in the step S7, the method of peeling off the glass substrate specifically includes: when the flexible substrate and the glass substrate are adhered together by an adhesive, the adhesive and the flexible substrate or the adhesive and the glass substrate may be separated from each other by the irradiation of laser light; or when the flexible substrate and the glass substrate are adhered together by vacuum bonding, a release film layer may be provided between the flexible substrate and the glass substrate at the time of vacuum attachment, the glass substrate and the flexible substrate are separated, or the glass substrate and the flexible substrate are separated by an excimer laser.

Another object of the present disclosure is to provide a method of manufacturing a liquid crystal display panel, the method including the steps of: S1: providing a lower support substrate and an upper support substrate; S2: arranging a lower glass substrate on the lower support substrate, and arranging an upper glass substrate on the upper support substrate; S3: arranging a lower flexible substrate on the lower glass substrate; S4: arranging an array layer and a pad area on the lower flexible substrate, and arranging a color blocking layer on the upper glass substrate; S5: assembling the upper support substrate and the lower support substrate to a box, and filling a liquid crystal layer between the color blocking layer and the array layer; S6: peeling off the upper support substrate and the lower substrate; S7: cutting the upper glass substrate, the lower glass substrate, and the flexible substrate according to a predetermined display panel size, and peeling the lower glass substrate and the flexible substrate after the cutting.

It is still another object of the present disclosure to provide a method of manufacturing an organic electroluminescence display panel, the method including the steps of: S1: providing a lower support substrate; S2: arranging a lower glass substrate on the lower support substrate; S3: arranging a lower flexible substrate on the lower glass substrate; S4: arranging an organic light emitting layer and a pad area on the lower flexible substrate; S5: arranging an encapsulation layer on the organic light emitting layer; S6: peeling off the lower support substrate; S7: cutting the lower glass substrate and the flexible substrate according to a predetermined display panel size, and peeling the lower glass substrate and the flexible substrate after the cutting.

In the above-mentioned method of manufacturing a liquid crystal display panel or an organic electroluminescence display panel, further, the step S7 specifically includes: cutting the lower glass substrate and/or the upper glass substrate in accordance with a predetermined display panel size, peeling the lower glass substrate opposite to the pad area of the lower flexible substrate, and cutting the lower flexible substrate connected between the two adjacent display panels; or cutting the glass substrate and/or the upper glass substrate in accordance with a predetermined display panel size, cutting the lower flexible substrate connected between the two adjacent display panels, and peeling the lower glass substrate opposite to the pad area of the lower flexible substrate of each display panel.

Advantageous effects of the present disclosure: the present disclosure provides a method of manufacturing a display panel using a thin and light glass substrate, and in the manufacturing process, by support the thin glass substrate with a thick support substrate, it is possible to avoid the occurrence of severe drooping and warping which can prevent the drooping and the overall warping of the both ends of the thin glass substrate, thereby enhancing the convenience and the accuracy in the manufacturing process of the display panel.

BRIEF DESCRIPTION OF THE DRAWINGS

The following description in conjunction with the accompanying drawings, the above and other aspects, features and advantages of the embodiments of the present disclosure will become more apparent from the accompanying drawings in which.

DETAILED DESCRIPTION OF PREFERRED EMBODIMENTS

Figure 1A:
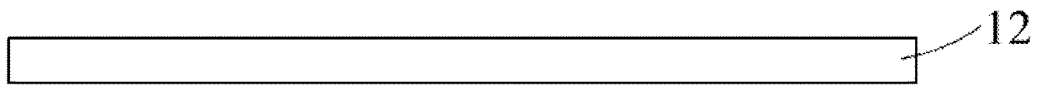
FIG. 1A to FIG. 1G are flow charts according to the manufacturing method for the liquid crystal display panel of the first embodiment of the present disclosure.
Figure 1A:
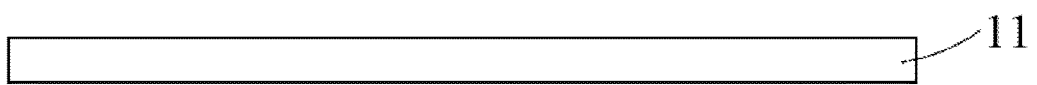

Hereinafter, detailed embodiments will be described with reference to the accompanying drawings of the present disclosure. However, in many different forms and embodiments of the present disclosure, and the disclosure should not be construed as limited to the specific embodiments set forth herein. Rather, these embodiments are provided to explain the principles of the disclosure and its practical application, thereby others skilled in the art to understand the disclosure for various embodiments and various modifications suited to the particular intended application.

In the drawings, the thicknesses of the layers and regions are exaggerated for the purpose of removing the device. Like reference numerals refer to the same elements throughout the drawings.

FIG. 1A to FIG. 1G are flow charts according to the manufacturing method for the liquid crystal display panel of the first embodiment of the present disclosure.

The method of manufacturing a liquid crystal display panel according to a first embodiment of the present disclosure includes:

Step one: refer to FIG. 1A, providing the support substrate 11 and the upper support substrate 12.

Here, the lower support substrate 11 and the upper support substrate 12 may be made of glass, ceramic, or metal. The thickness of the lower support substrate 11 and the upper support substrate 12 is between 0.5 mm and 1 mm. In the present embodiment, the lower support substrate 11 and the upper support substrate 12 are preferably made of glass, and the thickness of the lower support substrate 11 and the upper support substrate 12 is preferably 0.7 mm.

Figure 1B:
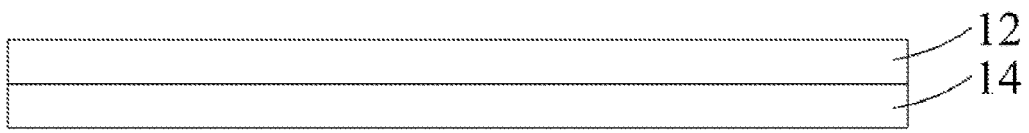
Figure 1B:
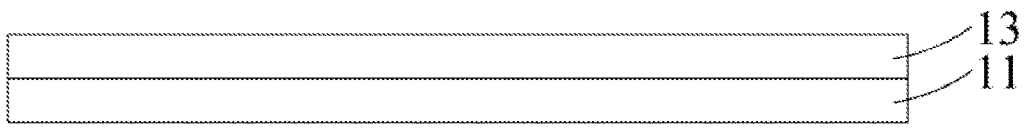

Step two: refer to FIG. 1B, arranging the glass substrate 13 on the lower support substrate 11, correspondingly, the upper glass substrate 14 is provided on the upper support substrate 12.

Here, the lower glass substrate 13 and the upper glass substrate 14 are thin, and their thickness ranges are between 0.05 mm and 0.4 mm, preferably between 0.1 mm and 0.15 mm. By placing a thinner glass substrate (such as the lower glass substrate 13 and the upper glass substrate 14) on a thicker support substrate (such as the lower support substrate 11 and the upper support substrate 12), a thicker support substrate can be used to provide support for the thinner glass substrate, reducing drooping at both ends of the thinner glass substrate and overall warping, thereby enhancing display convenience and accuracy of the panel manufacturing process.

Specifically, the method of arranging the lower glass substrate 13 and the upper glass substrate 14 on the lower support substrate 11 and the upper support substrate 12 specifically includes two kinds: 1. a method of attaching the support substrate and the glass substrate to each other by bringing them into contact under vacuum, in this case, the adhesion force between the support substrate and the glass substrate is an electrostatic force, a vacuum force, a surface tension, and the like; 2. the support substrate and the glass substrate are adhered together by an adhesive agent.

Figure 1C:
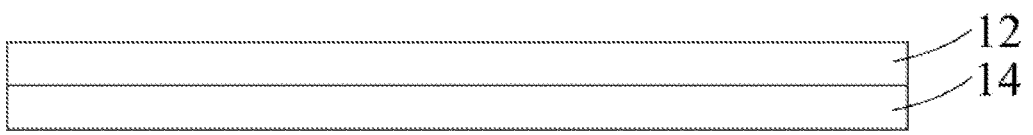
Figure 1C:
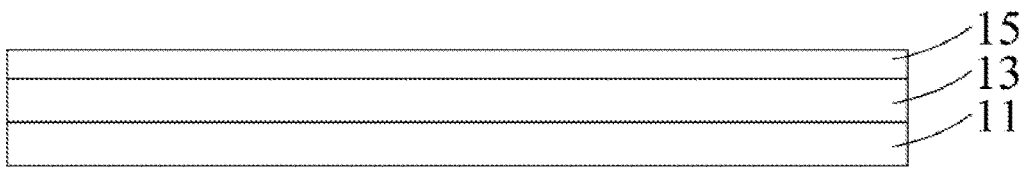

Step three: refer to FIG. 1C, arranging a foldable flexible substrate 15 on the lower glass substrate 13.

Here, the flexible substrate 15 may be formed of any of polyimide (PI), polycarbonate (PC), polyethersulfone (PES), polyethylene terephthalate (PET), polyethylene naphthalate (PEN), a polyarylate (PAR), a glass fiber reinforced plastic (FRP), or the like.

In particular, the arrangement of the flexible substrate 15 can be divided into two ways:

Method 1: on the lower glass substrate 13, a flexible material (i.e., the above-mentioned material for the flexible substrate 15) is coated with a coating process such as spin coating, slit coating, inkjet coating, etc., and the coated flexible material is subjected to curing.

Method 2: a flexible substrate, which has been made of a flexible material, is attached to the lower glass substrate by an adhesive agent. In some embodiments, the flexible substrate 15 may include not only one layer of organic material layer, but also two or more layers of organic material layer, while the organic layer may also include one, two, or more layers of inorganic material layer, wherein the inorganic layer may be made of SiNx and/or SiOx or the like.

Figure 1D:
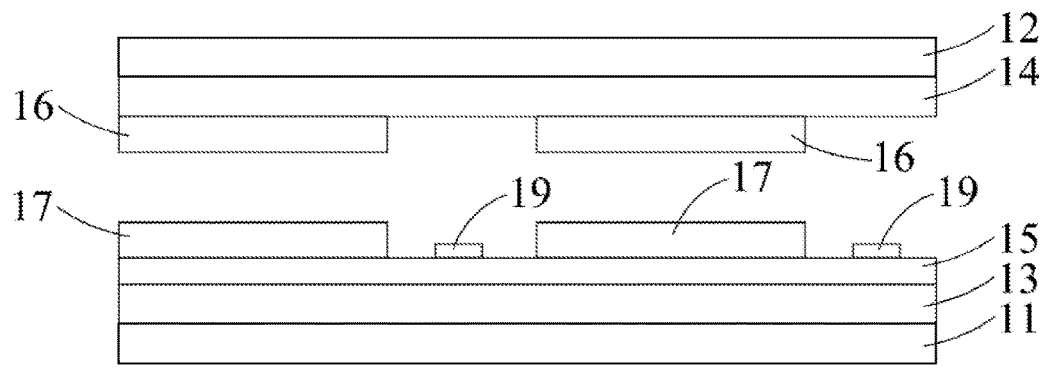

Step four: refer to FIG. 1D, arranging an array layer 17 and a pad area 19 (bonding area) on the flexible substrate 15, correspondingly, arranging a color blocking layer 16 on the upper glass substrate 14. It is to be noted that it may be arranging other necessary display elements on the flexible substrate 15 and the upper glass substrate 14, respectively, and the description thereof will not be repeated here. In addition, since the pad area 19 is usually provided in the non-display area of the liquid crystal display panel, the pad area may be made equal to the non-display area of the liquid crystal display panel.

Figure 1E:
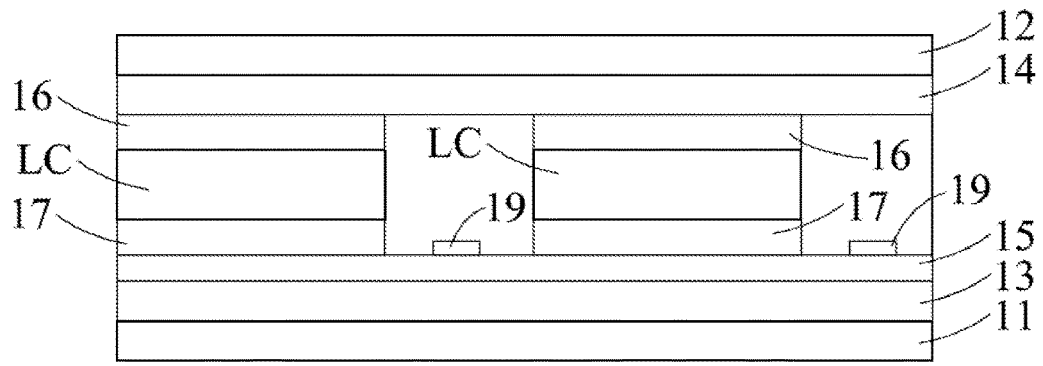

Step five: refer to FIG. 1E, aligning the upper support substrate 12 and the lower support substrate 11, and filling the liquid crystal layer LC between the color blocking layer 16 and the array layer 17 to complete the box aligning process (or the into box process) of the liquid crystal display panel.

Here, the upper support substrate 12 and the lower support substrate 11 function not only to protect the upper glass substrate 14, the lower glass substrate 13, and the display element between the upper glass substrate 14 and the lower glass substrate 13, but also enhance the ease of operation and alignment accuracy in the aligning and into box processes.

Figure 1F:
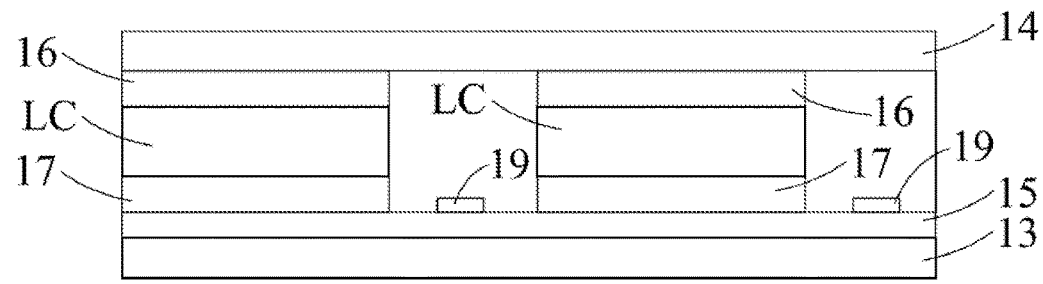

Step six: refer to FIG. 1F, peeling off the upper support substrate 12 and the lower support substrate 11.

Specifically, the method of peeling off the support substrate (i.e., the upper support substrate 12 and the lower support substrate 11) includes two types: 1. performing the support substrate by a plasma treatment using fluorine or the like; 2. preliminarily forming a protrusion pattern on the surface of the support substrate to reduce the adhesion force between the glass substrate and the support substrate, peeling off the support substrate by spraying air through a predetermined air-ejection device (not shown) to a space between the support substrate and the glass substrate.

Figure 1G:
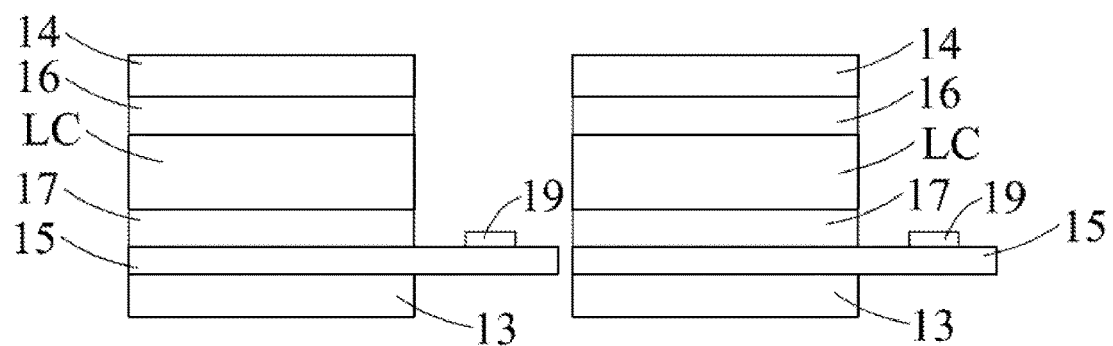

Step seven: refer to FIG. 1G, cutting the upper glass substrate 14 and the lower glass substrate 13 in accordance with the predetermined liquid crystal display panel size, after peeling off the lower glass substrate 13 corresponding to the pad area 19 on the flexible substrate 15, cutting off the flexible substrate 15 connected between the adjacent two liquid crystal display panels to obtain the two separate LCD panels shown in FIG. 1G. It should be noted, in FIG. 1G, only two formed liquid crystal display panel are shown, and in practice, three or more liquid crystal display panels may be formed as required.

It is to be understood that, in the step seven, as another embodiment, the flexible substrate 15 connected between the two adjacent liquid crystal display panels may be cut off first, and then the lower glass substrate 13 of each liquid crystal display panel opposite to the pad area 19 on the flexible substrate 15 is peeled off, respectively.

Specifically, the method of peeling off the lower glass substrate 13 opposite to the pad area 19 on the flexible substrate 15 includes the following two methods:

1. When the flexible substrate 15 and the lower glass substrate 13 are adhered together by an adhesive, the adhesive and the flexible substrate 15 or the adhesive and the lower glass substrate 13 may be separated from each other by irradiating a laser beam;

2. When the flexible substrate 15 and the lower glass substrate 13 are adhered together by vacuum bonding, arranging a release film layer between the lower glass substrate 13 and the flexible substrate 15 during vacuum bonding, the lower glass substrate 13 is automatically separated from the flexible substrate 15 after the cutting, or the lower glass substrate 13 is separated from the flexible substrate 15 directly by excimer laser without providing a release film layer.

In the liquid crystal display panel manufactured by the manufacturing method of the first embodiment of the present disclosure, the thin upper glass substrate 12 and the lower glass substrate 13 serve to maintain a uniform cell thickness of the liquid crystal display panel and can provide a flat, smooth surface feel and display plane.

Figure 2:
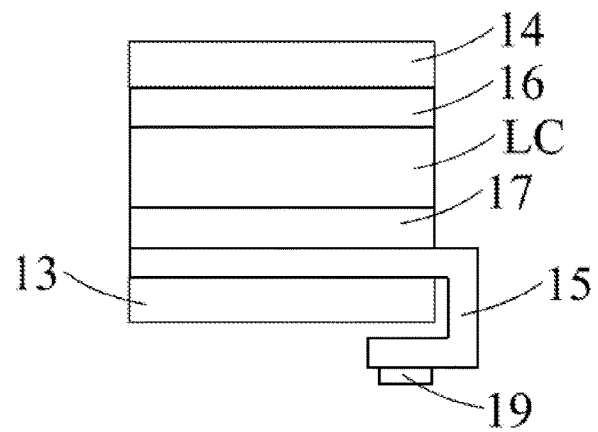
FIG. 2 is a bending diagram of the flexible substrate of the liquid crystal display panel manufactured by the manufacturing method for the liquid crystal display panel of the first embodiment.

In addition, refer to FIG. 2, in each completed liquid crystal display panel, the length of the flexible substrate 15 is longer than the length of the lower glass substrate 13, so that the flexible substrate 15 can be bent so that the pad region 19 thereon is located in the backlight module or under the backlight module, thus extending to and set in the internal electronic products, thereby enhancing such as smart phones, tablet PCs, smart watches and other electronic products accounted for the screen.

FIG. 3A to FIG. 3G are manufacturing process diagrams of the manufacturing method for the organic electroluminescence display panel according to the second embodiment of the present disclosure.

Figure 3A:
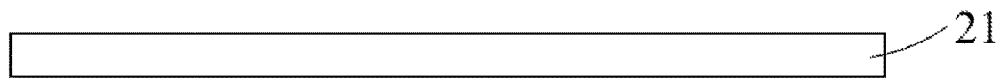
FIG. 3A to FIG. 3G are manufacturing process diagrams of the manufacturing method for the organic electroluminescence display panel according to the second embodiment of the present disclosure.

The manufacturing method for the organic electroluminescence display panel according to the second embodiment of the present disclosure includes:

Step one: refer to FIG. 3A, providing a lower support substrate 21.

Here, the lower support substrate 21 may be made of glass, ceramic, or metal. The thickness of the lower support substrate 21 is between 0.5 mm and 1 mm. In the present embodiment, the lower support substrate 21 is preferably made of glass, and the thickness of the lower support substrate 21 is preferably 0.7 mm.

Figure 3B:
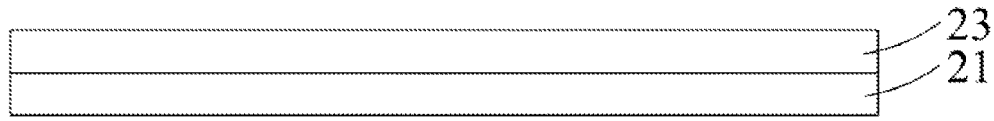

Step two: refer to FIG. 3B, arranging a lower glass substrate 23 on the lower support substrate 21.

Here, the lower glass substrate 23 is thinner and has a thickness ranging between 0.05 mm and 0.4 mm, preferably between 0.1 mm and 0.15 mm. The thinner lower glass substrate 23 is provided on the thicker lower support substrate 21 so that the thin lower glass substrate 23 can be supported by the thicker lower support substrate 21 to reduce the drooping at both ends and the overall warping of the thinner lower glass substrate 23, thereby enhancing the convenience and accuracy of the manufacturing process of the display panel.

Specifically, the method of arranging the lower glass substrate 23 on the lower support substrate 21 specifically includes two types: 1. the lower support substrate 21 and the lower glass substrate 23 are brought into contact with each other in a vacuum state to be adhered together, in this case, the adhesion force between the lower support substrate 21 and the lower glass substrate 23 is an electrostatic force, a vacuum force, a surface tension, and the like; 2. adhering the lower support substrate 21 and the lower glass substrate 23 together by an adhesive agent.

Figure 3C:
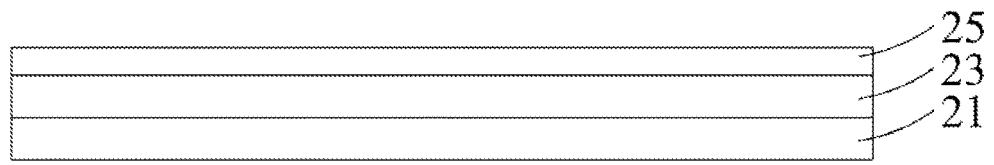

Step three: refer to FIG. 3C, arranging a foldable flexible substrate 25 on the lower glass substrate 23.

Here, the flexible substrate 25 may be formed of any of polyimide (PI), polycarbonate (PC), polyethersulfone (PES), polyethylene terephthalate (PET), polyethylene naphthalate (PEN), a polyarylate (PAR), or a glass fiber reinforced plastic (FRP), or the like.

Specifically, arranging the flexible substrate 25 can be divided into two modes:

Method one: coating the flexible material (i.e., the material of the above-described flexible substrate 25) on the lower glass substrate 23 by a coating process such as spin coating, slit coating, ink jet coating, etc., and curing the coated flexible material.

Method two: adhering the flexible substrate 25 that has been made of the flexible material on the lower glass substrate 23. In some embodiments, the flexible substrate 25 may include not only one organic layer, but also two or more organic layers, while the organic layer may also include one, two, or more inorganic layers, wherein the inorganic layer may be made of SiNx and/or SiOx or the like.

Figure 3D:
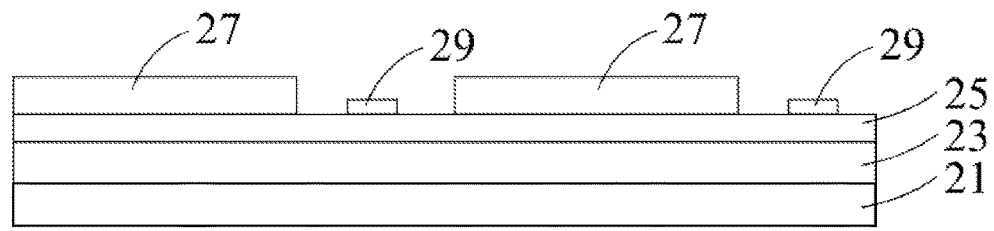

Step four: refer to FIG. 3D, arranging the organic light emitting layer 27 and the pad area (bonding area) 29 on the flexible substrate 25. It is to be noted that, other necessary display elements may be provided on the flexible substrate 25, and will not be described here. In addition, since the pad area 29 is usually provided in the non-display area of the organic electroluminescence display panel, the pad area 29 may be made equal to the non-display area of the organic electroluminescence display panel.

Figure 3E:
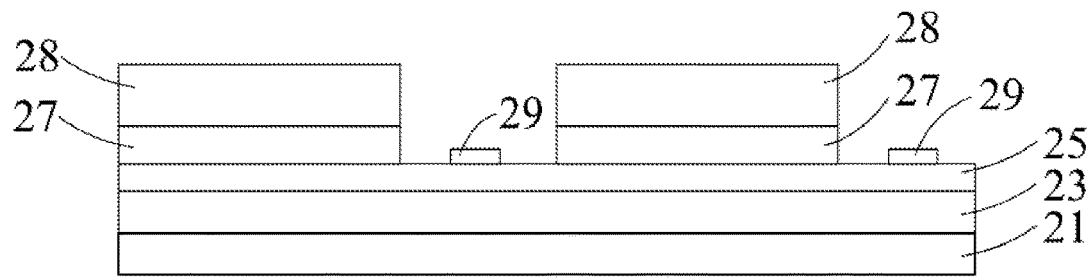

Step five: refer to FIG. 3E, arranging the encapsulation layer 28 on the organic light emitting layer 27 to achieve water vapor and oxygen isolation. Here, the encapsulation layer 28 may be a glass cover or a thin film encapsulation layer.

Figure 3F:
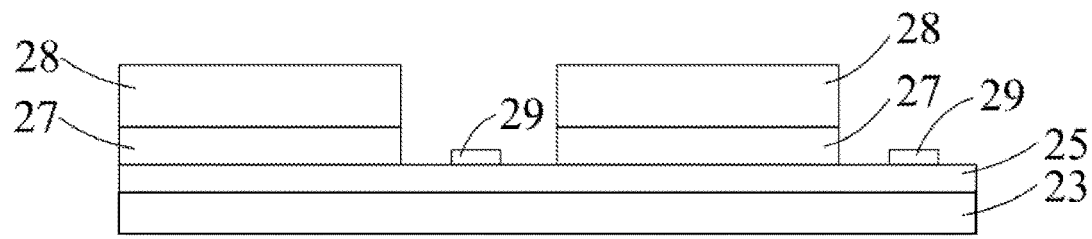

Step six: refer to FIG. 3F, peeling off the lower support substrate 21.

Specifically, the method of peeling off the lower support substrate 21 can be divided into two modes: 1. performing the lower support substrate 21 by a plasma treatment using fluorine or the like; 2. forming a protrusion pattern on the surface of the lower support substrate 21 in advance to reduce the adhesion force between the lower glass substrate 23 and the lower support substrate 21, ejecting air into the space between the lower glass substrate 23 and the lower support substrate 21 by the predetermined air ejection device (not shown) to peeling off the lower support substrate 21.

Figure 3G:
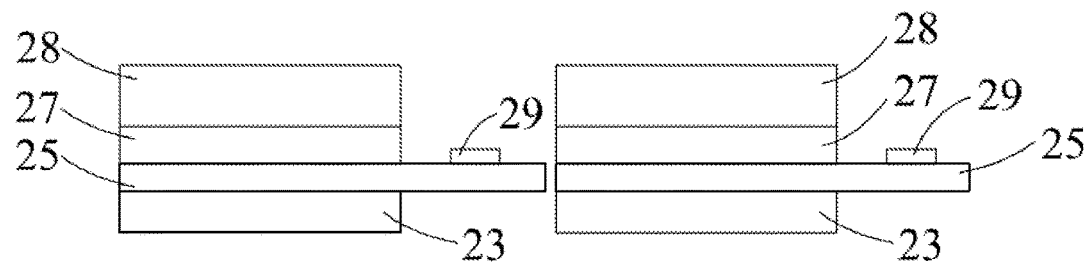

Step seven: refer to FIG. 3G, cutting the glass substrate 23 in accordance with a predetermined display panel size, after peeling off the lower glass substrate 23 opposite to the pad area 29 on the flexible substrate 25, cutting the flexible substrate 25 connected between the two adjacent organic electroluminescence display panels to obtain two independent organic electroluminescence display panels shown in FIG. 3G. It is to be noted that only two organic electroluminescence display panels are formed in FIG. 3G, and in practice, three or more organic electroluminescence display panels may be formed as required.

It is to be understood that, in step seven, as another embodiment, may cutting off the flexible substrate 25 connected between two adjacent organic electroluminescence display panels, and peeling off the lower glass substrate 23 of each organic electroluminescence display panel opposite to the pad area 29 on the flexible substrate 25.

Specifically, the method of peeling off the lower glass substrate 23 opposite to the pad area 29 on the flexible substrate 25 can be divided into two modes:

1. when the flexible substrate 25 and the lower glass substrate 23 are adhered together by an adhesive, the adhesive and the flexible substrate 25 may be separated from each other or the adhesive and the lower glass substrate 23 may be separated from each other by irradiating a laser beam;

2. when the flexible substrate 25 and the lower glass substrate 23 are attached together by vacuum bonding, a release film layer may be provided between the lower glass substrate 23 and the flexible substrate 25 at the time of vacuum attachment, the lower glass substrate 23 is automatically separated from the flexible substrate 25 after the cutting, the lower glass substrate 23 is separated from the flexible substrate 25 directly by excimer laser without providing a release film layer.

In the organic electroluminescence display panel manufactured by the manufacturing method according to the second embodiment of the present disclosure, the thin lower glass substrate 23 can provide a flat, smooth surface feel and a display plane.

Figure 4:
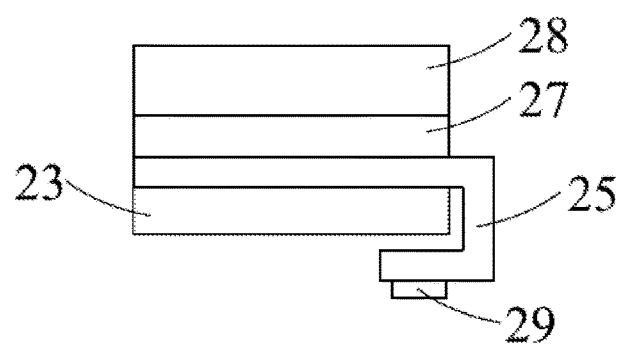
FIG. 4 is a bending diagram of the flexible substrate of the organic electroluminescence display panel manufactured by the manufacturing method for the organic electroluminescence display panel of the second embodiment.

In addition, refer to FIG. 4, in each completed organic electroluminescence display panel, the length of the flexible substrate 25 is longer than the length of the lower glass substrate 23, so that the flexible substrate 25 can be bent so that the pad area 29 thereon is located below the lower glass substrate 23 so as to extend to and within the electronic product, thereby enhancing the screen accounting ratio of the electronic products such as smart phones, tablet computers, smart watches and the like.

Although reference to particular embodiments shown and described the present disclosure, those skilled in the art will understand: without departing from the spirit and scope of the appended claims and their equivalents of the present disclosure, a case, in this that various changes in form and details.

What is claimed is:

1. A method for manufacturing liquid crystal display panel, wherein, the manufacturing method comprises:
    S1: providing a lower support substrate and an upper support substrate;
    S2: arranging a lower glass substrate on the lower support substrate, and arranging an upper glass substrate on the upper support substrate;
    S3: arranging a lower flexible substrate on the lower glass substrate;
    S4: arranging an array layer and a pad area on the lower flexible substrate, and arranging a color blocking layer on the upper glass substrate;
    S5: assembling the upper support substrate and the lower support substrate to a box, and filling a liquid crystal layer between the color blocking layer and the array layer;
    S6: peeling off the upper support substrate and the lower substrate;
    S7: cutting the upper glass substrate, the lower glass substrate, and the flexible substrate according to a predetermined display panel size, and peeling the lower glass substrate and the flexible substrate after the cutting.

2. The manufacturing method according to claim 1, wherein, the step S7 specifically comprises:
    cutting the lower glass substrate and the upper glass substrate in accordance with a predetermined display panel size, peeling the lower glass substrate opposite to the pad area of the lower flexible substrate, and cutting the lower flexible substrate connected between the two adjacent liquid crystal display panels; or
    cutting the lower glass substrate and the upper glass substrate in accordance with a predetermined display panel size, cutting the lower flexible substrate connected between the two adjacent display panels, and peeling the lower glass substrate opposite to the pad area of the lower flexible substrate of each liquid crystal display panel.

* * * * *